United States Patent [19]

Sakata

[11] Patent Number: 5,261,167

[45] Date of Patent: Nov. 16, 1993

[54] VERTICAL HEAT TREATING APPARATUS

[75] Inventor: Kazunari Sakata, Sagamihara, Japan

[73] Assignee: Tokyo Electron Sagami Limited, Kanagawa, Japan

[21] Appl. No.: 766,205

[22] Filed: Sep. 27, 1991

[30] Foreign Application Priority Data

Sep. 27, 1990 [JP] Japan ................. 2-258447
Oct. 9, 1990 [JP] Japan ................. 2-271354
Oct. 9, 1990 [JP] Japan ................. 2-271355

[51] Int. Cl.⁵ ............................................. F26B 21/06
[52] U.S. Cl. ....................................... 34/82; 454/56;
454/187; 432/247; 55/385.2; 34/77
[58] Field of Search ................ 34/202, 212, 219, 224,
34/82, 76, 77, 79, 81; 454/56, 187; 432/247;
55/385.2, DIG. 29

[56] References Cited

U.S. PATENT DOCUMENTS

3,944,405 3/1976 van Calsteren et al. .............. 454/56
4,832,717 5/1989 Peters ................................... 454/56
4,927,438 5/1990 Mears et al. ........................ 454/56

Primary Examiner—Henry A. Bennet
Assistant Examiner—Denise L. Gromada
Attorney, Agent, or Firm—Oblon, Spivak, McClelland, Maier & Neustadt

[57] ABSTRACT

A vertical heat treating apparatus comprises a casing having an opening through which articles to be processed are loaded and unloaded, a heat treating furnace provided in the casing, a loading and unloading mechanism provided under the heat treating furnace so as to load the articles to be processed in and unload the same from the heat treating furnace, and a clean air flow forming unit provided in a space which is formed in the casing and in which the loading and unloading mechanism is provided so as to form a clean air flow conducted from one side of the casing to the opposite side thereof.

7 Claims, 7 Drawing Sheets

VERTICAL HEAT TREATING APPARATUS

BACKGROUND OF THE INVENTION

1. Field of the Invention

This invention relates to a vertical heat treating apparatus used in a thermal diffusion process or a film formation process in manufacturing semiconductor devices.

2. Description of the Related Art

Recently, there has been used vertical heat treating apparatuses which can be located in a small space and can be operated in a dustless state.

The vertical heat treating apparatus of this type is provided in a casing with a reaction tube, a uniformly heating tube surrounding the reaction tube, a heater and a substantially vertical heat treating furnace made of heat insulating material or the like. In the lower portion of the casing is provided a boat elevator for loading a wafer boat, which holds semiconductor wafers (which are articles to be processed), in and unloading the wafer boat from the heat treating furnace. An opening through which the semiconductor wafers are loaded in and unloaded from the heat treating furnace is formed in the front face of the casing in which the heat treating furnace and the boat elevator are housed.

Vertical heat treating apparatuses have been known which each have an air fan and a dust filter provided in the rear lower portion of the casing such that clean air is caused to flow from the rear portion to the front portion in the region of the boat elevator thereby to prevent the attachment of dust to the wafers.

The floor space can be rendered less in these vertical heat treating apparatuses than in the horizontal heat treating apparatuses in which a heat treating furnace is disposed substantially horizontally. Further, in the vertical heat treating apparatus, a wafer boat is loaded in and unloaded from the heat treating furnace without contacting the wafer boat with the reaction tube, allowing for dustless heat treating in the apparatus.

There have been used semiconductor wafers having a large diameter such as 8 inches, and the circuit patterns of semiconductor devices have become finer and finer. In order to accord with this tendency, it is required in the vertical heat treating apparatus that wafers having a large diameter be processed by elevating the yield of the processed wafers so as to prevent dust from attaching to the wafers, the floor space be reduced

SUMMARY OF THE INVENTION

The object of this invention is to provide a vertical heat treating apparatus by means of which wafers having a large diameter can be processed by elevating the yield of the processed wafers so as to prevent dust from attaching to the wafers, the floor space is reduced and the maintenance is improved.

This object is attained by providing a vertical heat treating apparatus which comprises a casing having an opening through which unloading articles to be processed are loaded and unloaded; a heat treating furnace provided in the casing; loading and unloading means provided under the heat treating furnace, for loading the articles to be processed in and unloading the same from the heat treating furnace; and clean air flow forming means provided in a space which is in the casing and in which the loading and unloading means is provided, for forming a clean air flow conducted from one lateral side of the casing to the opposite lateral side thereof.

In an embodiment of the vertical heat treating apparatus according to this invention, maintenance doors are provided on the one lateral side of the casing, and an air fan and a duct filter are mounted in the maintenance doors such that clean air flows in a lengthwise direction of the apparatus in the area close to a boat elevator disposed in the casing.

Even if, therefore, a wafer treating mechanism is provided in front of the boat elevator, dust is prevented from attaching to semiconductor wafers as articles to be processed, and thus yield is improved. Provision of the maintenance doors on the one side of the casing and an air fan and a dust filter in each maintenance door reduces the floor space of the vertical heat treating apparatus and ensures good maintenance of the apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

This invention will now be described by way of an embodiment and a modification with reference to the drawings.

The embodiment of this invention relates to a vertical heat treating apparatus in which semiconductor wafers of a diameter of 8 inches are heat-treated.

Figure 2:
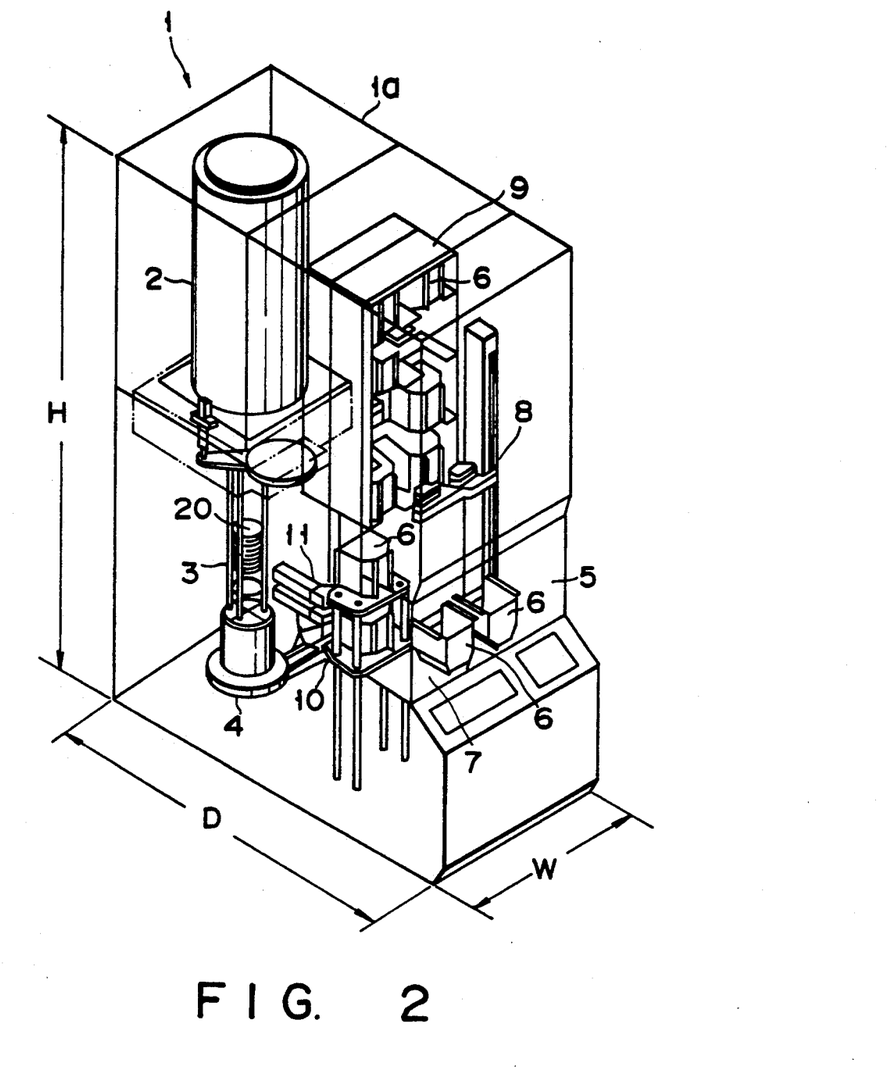
FIG. 2 is a perspective view of the main portion of the vertical heat treating apparatus of FIG. 1.

As shown in FIG. 2, a casing $1a$ of the vertical heat treating apparatus 1 is made from an iron plate or the like and has a substantially box form. The width (W), the depth (D) and the height (H) are 95 cm, 210 cm and 280 cm, for example, respectively.

In the upper rear portion of the casing $1a$ is provided a substantially upright heat treating furnace 2 comprising a cylindrical reaction tube, a uniformly heating tube surrounding the reaction tube, a heater and a thermally insulating member. The heat treating furnace 2 is connected to a reaction-gas supplying system (not shown) and an air discharging system (not shown) such that the furnace is used to process semiconductor wafers 20 (which are articles to be treated) heated to a predetermined temperature, the process being the formation of a film on each wafer, for example. Under the heat treating furnace 2 in the casing 1a is provided a boat elevator 4 for loading a wafer boat 3 carrying the semiconductor wafers 20 in and unloading the same from the heat treating furnace 2.

In the front face of the casing 1a is formed an opening 5 which is provided with a door (not shown) and through which wafer cassettes 6 containing the semiconductor wafers 20 to be treated are transported in and out of the casing 1a.

In this embodiment, a carrier I/O port 7 is provided in the opening 5 such that the port 7 holds two wafer cassettes 6 at a time in a substantially horizontal manner or in such a manner that the semiconductor wafers 20 are disposed vertically. Behind the carrier I/O port 7 is placed a carrier transfer 8 for transferring the wafer cassettes 6.

The carrier I/O port 7 comprises a wafer aligning mechanism (not shown) for aligning the semiconductor wafers in the wafer cassettes 6 in a predetermined direction by means of orientation flats of the wafers 20, and a horizontal-vertical position changing mechanism (not shown) for rotating the wafer cassettes 6 through 90° between the horizontal position and the vertical position. After the semiconductor wafers in the wafer cassettes 6 have been arranged in the predetermined direction, the wafer cassettes 6 are turned to take the vertical positions by means of the wafer aligning mechanism such that the semiconductor wafers are located horizontally. Thereafter, the wafer cassettes 6 are transported by means of the carrier transfer 8.

Behind the carrier transfer, a carrier stage 9 is provided at the upper portion behind the carrier transfer 8, and a transfer stage 10 is disposed at the lower portion. Behind the transfer stage 10 is placed a wafer transfer 11 for transferring semiconductor wafers. The carrier stage 9 is constructed such that it temporarily contains a plurality of (eight, for example) wafer cassettes 6 arranged in a stage manner, when the wafer cassettes 6 are transported in the casing 1a. Wafer cassettes 6 (two, for example) are accurately positioned on the transfer stage 10, and the wafers 20 contained in each wafer cassette 6 are moved by means of the wafer transfer 11 to the wafer boat 3 mounted on the boat elevator 4.

Figure 1:
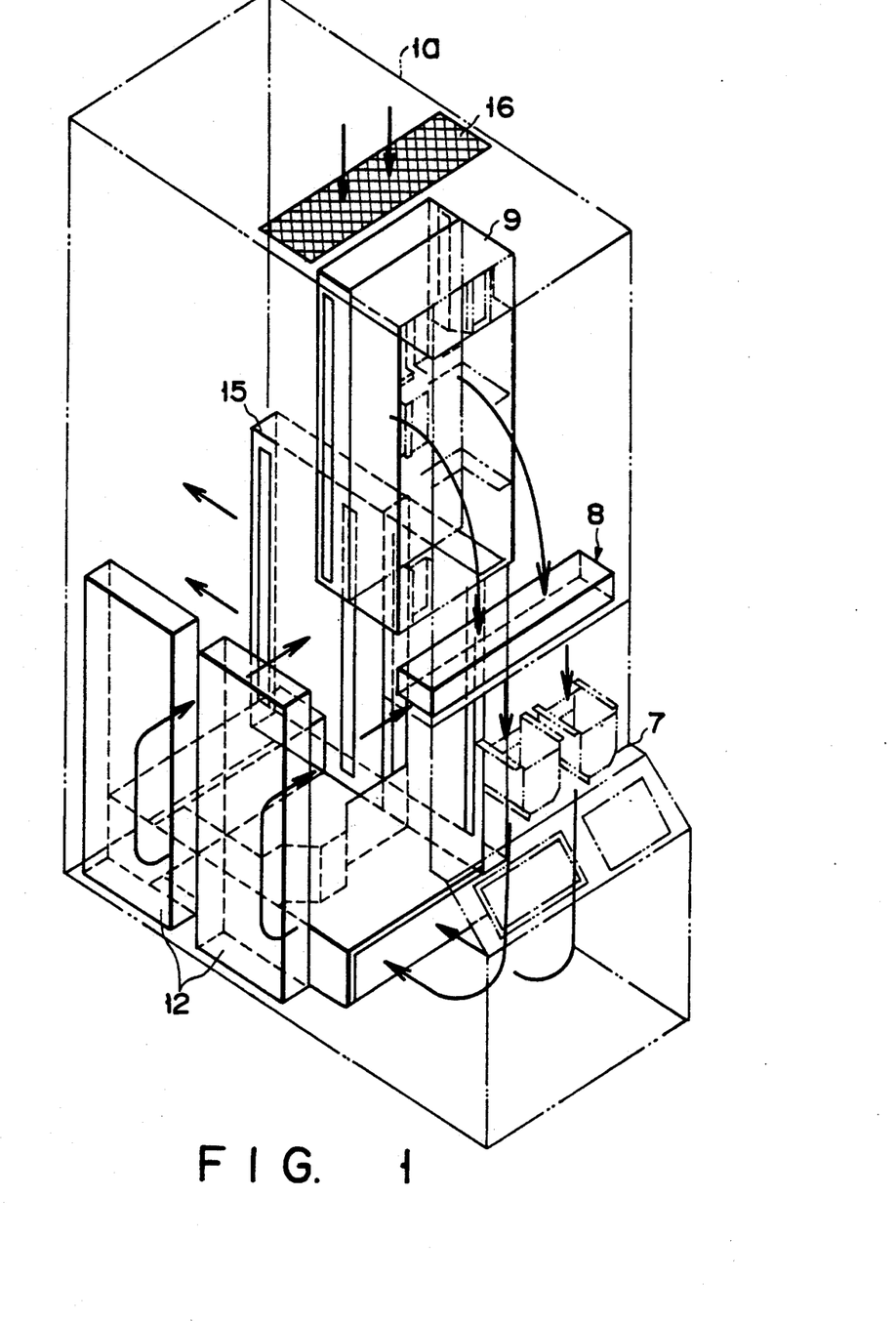
FIG. 1 is a perspective view showing air flows in a vertical heat treating apparatus according to one embodiment of this invention.

As shown by arrows in FIG. 1, air taken from an opening 16 formed in the ceiling of the casing 1a into the casing 1a flows downward in the casing 1a and is caused to flow in the bottom duct through the carrier stage 9, the carrier transfer 8 and the carrier I/O port 7 in succession. Then, the air forms a clean air flow moving from the corresponding maintenance door 1 to the air discharging portion 15. The air flow passes the boat elevator 4, the wafer transfer 1 and the transfer stage 10.

Figure 3:
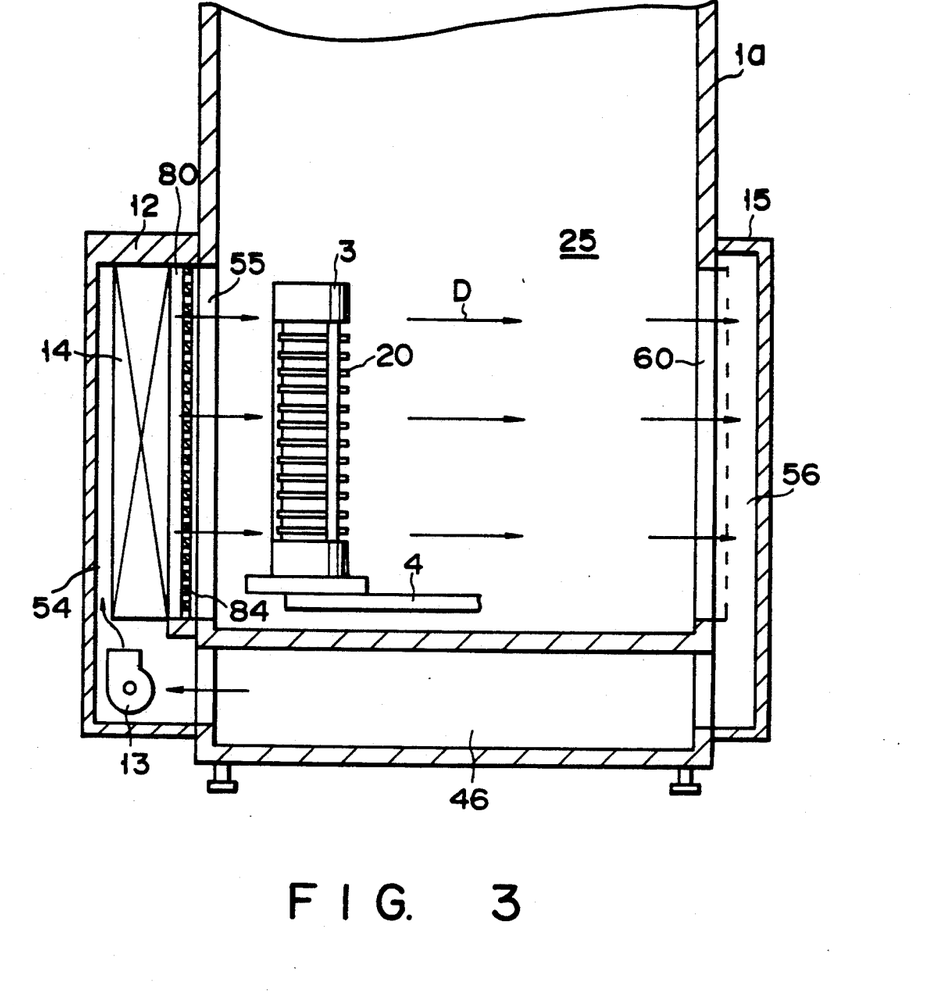
FIG. 3 is a cross-sectional view of a clean air flow forming portion of the vertical heat treating apparatus.

As shown in FIG. 1, two maintenance doors 12 are provided on the left side wall of the casing 1a. FIG. 3 illustrates that each maintenance door 12 contains an air fan 13 and a dust filter 14. Air taken in from the bottom portion of the maintenance door 12 is cleaned by the filter 14 and is sent out through substantially the whole area of the filter 14. An air discharging portion is provided on the right wall of the casing 1a so as to be placed opposite to the corresponding maintenance door 12. Air sent out from the maintenance door 12 is discharged in the rear portion of the casing 1a and part of the air circulates through the interior of the casing 1a via a bottom duct.

Air fans and duct filters (neither shown) are provided in the carrier stage 9, the carrier transfer 8 and the carrier I/O port 7 and are used to form clean air flows so as to prevent dust from attaching to semiconductor wafers.

Figure 4:
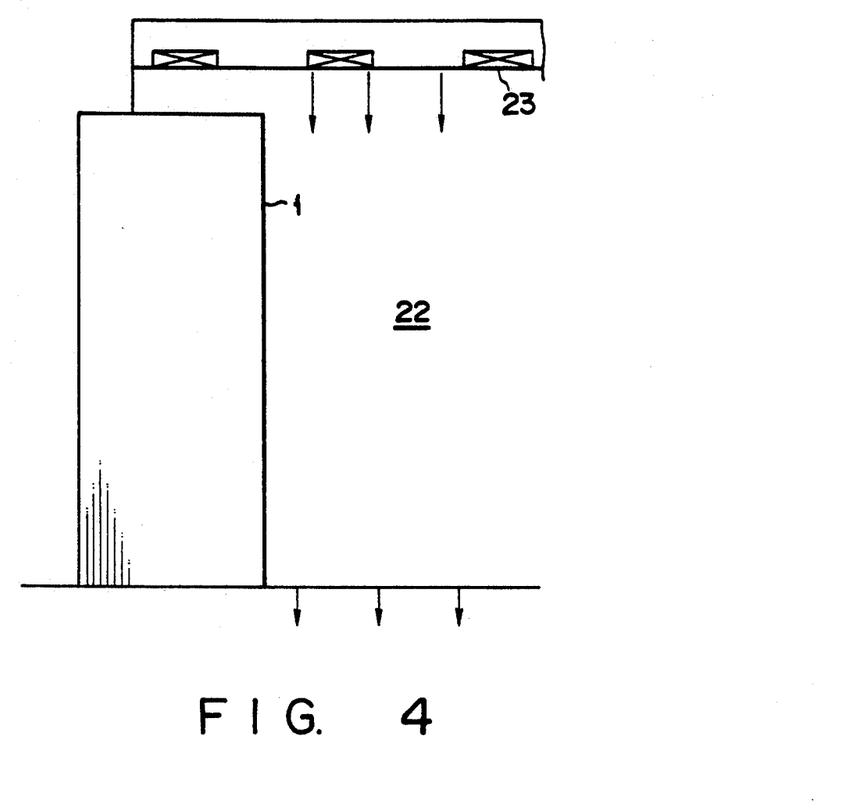
FIG. 4 is a schematic view of the vertical heat treating apparatus installed in a clean room.

As shown in FIG. 4, the vertical heat treating apparatus 1 is housed in a clean room 22 which is provided with a filtering device 23 for allowing clean air to flow downward in the clean room 22.

The operation of the vertical heat treating apparatus according to this embodiment will now be described.

The heat treating furnace 2 is heated to a predetermined temperature according to the selected process in advance. The air fans 13 provided in the maintenance doors 12 and the other air fans provided in the other portions are driven such that the clean air flows in the casing 1a as shown by the arrows in FIG. 1. Two wafer cassettes 6 each containing a plurality of (25, for example) semiconductor wafers, as articles to be processed, having a diameter of substantially 8 inches (20 cm), for example, are loaded at a time at the predetermined position on the carrier I/O port 7 by means of a transportation robot, for example.

In the vertical heat treating apparatus 1, semiconductor wafers 20 in the wafer cassettes 6 are arranged in the predetermined direction by means of the wafer aligning mechanism (not shown). Then, the wafer cassettes 6 are turned by means of the horizontal-vertical position changing mechanism to take a vertical position and to face rearward in such a manner that the semiconductor wafers are disposed horizontally. The wafer cassettes 6 are moved to the carrier stage 9 by means of the carrier transfer 8. This process is repeated until the required number of wafer cassettes 6 are accommodated in the carrier stage 9.

Thereafter, the wafer cassettes 6 on the carrier stage 9 are moved to the transfer stage 10 in turn, and the semiconductor wafers 20 in the wafer cassettes 6 are transferred onto the wafer boat 3 on the boat elevator 4 by means of the wafer transfer 11.

After the required number of (100 or more, for example) semiconductor wafers have been loaded, the boat elevator 4 is lifted. The wafer boat 3 is put in the heat treating furnace 2, and then the semiconductor wafers are heat-treated at a predetermined temperature for a predetermined time in a predetermined atmosphere. After the heat treatment, the heat-treated semiconductor wafers are unloaded in the reverse processes to the processes as mentioned above.

In the course of the heat treating processes, clean air flows are formed in the regions where the semiconductor wafers as the articles to be processed are present, that is, in the region on the carrier stage 9, the carrier transfer 8, in the carrier I/O port 7, and on the boat elevator 4, the wafer transfer 11 and the transfer stage 10. In the lower portion of the casing 1a in particular, clean air is caused to flow in a lengthwise direction of the apparatus, by means the air fan 1 through the dust filter 14 provided in the maintenance door 12, to the regions on the boat elevator 4, the wafer transfer and the transfer stage 10 in the casing 1a. On the contrary to the case in which clean air flows in the rearward direction, very clean air is blown on the semiconductor wafers in the casing 1a, just after the clean air has passed through the dust filter 14. This prevents dust from attaching to the semiconductors and ensures improvement of yield.

If air were caused to flow in the rearward direction to the regions in the casing 1a, the air passing through the region on the boat elevator 4 would be conducted to the region on the wafer transfer 11 and then would flow to the region on the transfer stage 10. Dust would be contained in the cleaned air before the air flows arrive at the semiconductor wafers which were disposed at the downstream of the air flows. Thus, the dust in the air flow would be likely to attach to the semiconductor wafers. Since, however, the air flows in the left-to-right direction in this embodiment, this problem is solved.

The provision of the air fans and the dust filter 14 in the maintenance doors 12 reduces the floor space of the heat treatment apparatus.

There might be the possibility that only the dust filters 14 would be provided in the maintenance doors 12 and the air fans 13 would be disposed in the lower portion of the casing 1a. In this case, however, air leakage would be likely to occur at the connecting portions in an air passageway between the air fans 13 and the maintenance doors 12, and dust would be blown off from the filter unit. In this connection, it is preferred that the air fans 13 and the dust filters 14 are provided in the maintenance doors 12.

In this embodiment, two maintenance doors 12 are provided such that they are rendered small to reduce spaces required, at the corresponding lateral side of the casing 1a, for opening and closing the maintenance doors 12. In other words, if a single maintenance door were provided, a large space which would become a large dead space would be required, at the corresponding lateral side of the casing, for opening and closing the maintenance door.

Further, the board elevator 4, the wafer transfer 11, the transfer stage 10, etc. in the casing 1a are accessible through the maintenance doors 12 at the corresponding side of the casing 1a, thereby improving the capability of maintenance.

In this embodiment in particular, semiconductor wafers having a diameter of 8 inches are used, and the board elevator 4 and the wafer transfer 11 are arranged in the crosswise direction in the casing 1a, the depth of the casing 1a becomes large. Therefore, if the maintenance doors were provided behind the casing 1a, the capability of maintenance would remarkably be deteriorated. In this embodiment, however, the wafer transfer 11 and the others are accessible laterally through the maintenance doors 12 at the corresponding lateral side of the casing 1a, thereby ensuring the enhanced capability of maintenance.

An air cleaning apparatus in which the vertical heat treating apparatus 1 is equipped will now be described in detail.

Figure 5:
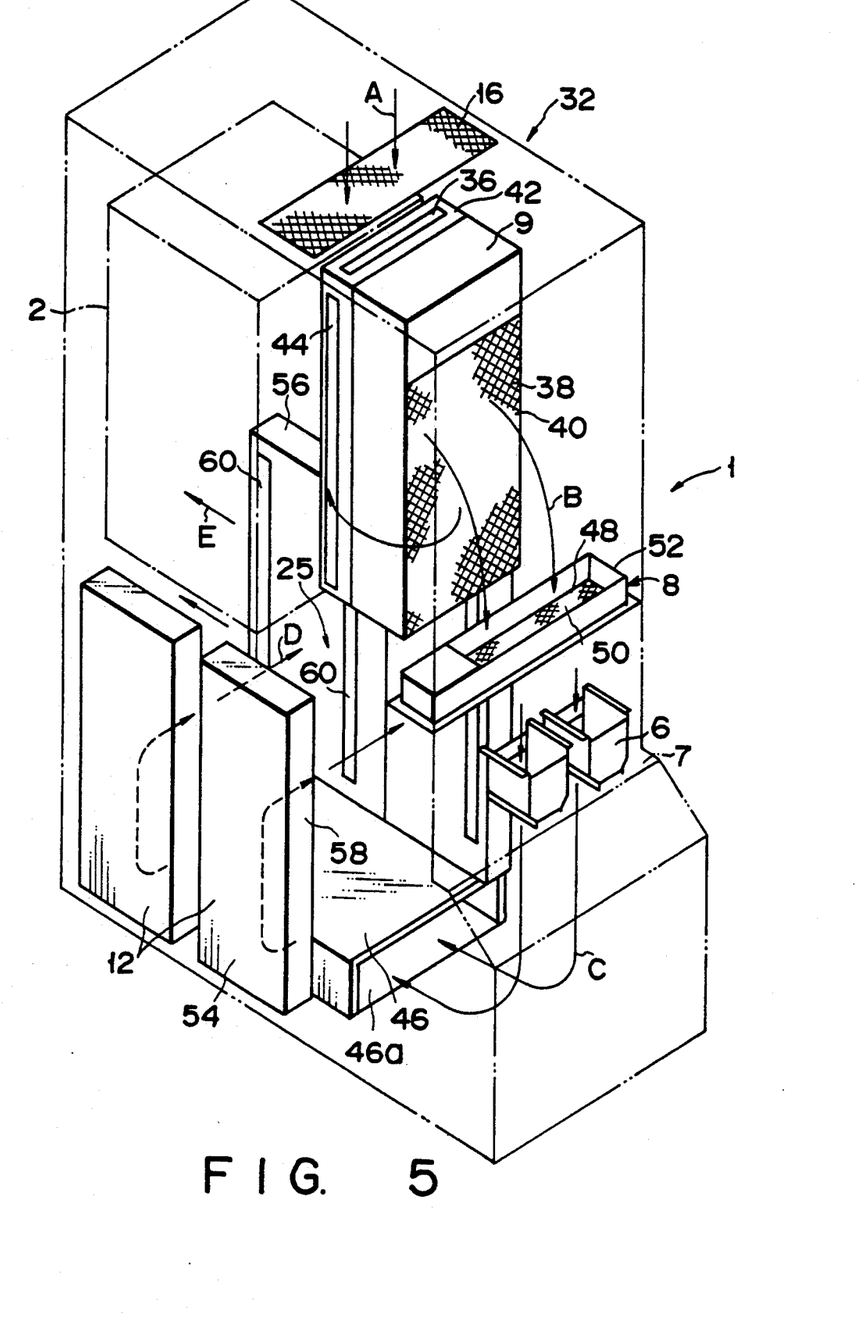
FIG. 5 is a perspective view of the clean air flow forming portion of the vertical heat treating apparatus.

As shown in FIG. 5, an air cleaning apparatus 32 has a clean air intake port 16 made of meshed metal and formed on the top face of the upper face of the apparatus 32 and a slit 36 formed in the upper surface of the carrier stage 9. Air is sucked in through the slit 36 from the intake port 16 in the form of a air flow A and is discharged in the form of an air flow B from an air discharge portion 40 having an area of 1 m$^2$, for example, and provided with a filter 38 on the carrier stage 9, by means of a first blower unit 42 including an air fan (not shown). The first blower unit 42 is provided with a second slit 44 through which part of air forming an air flow B renters the first blower unit 42 and comes out of the unit 42 as an air blow B through the filter 38 again. The second slit 44 forms part of an air circulating path.

On the inner face of the front wall of the casing 1a is provided a second blower unit 52 housing an air fan (not shown) and having a filter 50 mounted on an air discharging portion 48 of an area of 0.25 m$^2$, for example. The second blower unit 52 is mounted on the carrier transfer 8, air delivered from the first blower unit 42 in the form of an air flow B passes through the region on the wafer cassettes 6 set on the carrier I/O port 7 and is conducted as an air flow C to a bottom duct 46 prepared in the bottom portion of the casing 1a.

Figure 6:
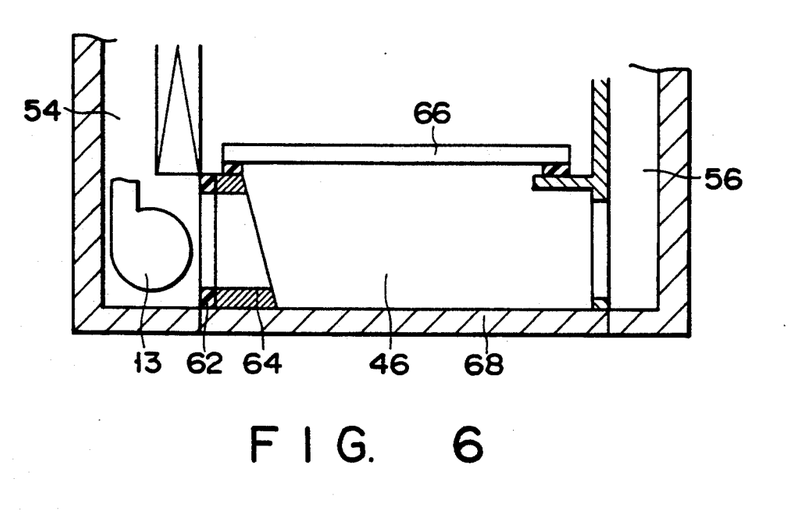
FIG. 6 is a cross-sectional view of a bottom duct of the vertical heat treating apparatus.

As shown in FIGS. 3 and 6, a third blower unit 54 and a side duct 56 disposed opposed to the unit 54 are connected to the bottom duct 46. The third blower unit 54 has a filter 14 and an air discharging portion 55 having an area of 2 m$^2$, for example. A third slit 60 is formed in the lateral wall of the side duct 56. Air passing through the filter 14 and sent out of the third blower unit 54 is introduced into the side duct 56 through the slit 60 to form a clean air flow D in a loading space 25.

As shown in FIG. 6, the third blower unit 54, the bottom duct 46 and the side duct 56 communicate with one after another. The bottom duct 46 is connected to the third blower unit 54 via a connecting member 64 and a packing 62 and the connecting ring 64 and the side duct 56 are bridged by a bottom plate 66.

The air fan 13 is provided in the third blower unit 54 and, as shown in FIG. 5, the opening of the bottom duct 46 constitutes a clean air intake port for clean air coming out of the second blower unit 52. In the bottom duct 46 are arranged a control unit of the boat elevator, a moving mechanism of the wafer transfer and the other electric equipment.

The operation of the air cleaning apparatus will now be described.

Wafer cassettes 6 housing wafers 20 are set on the carrier I/O port 7, and then the air fan of the first blower unit 42 is started. In order to cause air to flow in the vertical heat treating apparatus 1 at a predetermined speed of 0.3 m/s, for example, the air of 4.5 m$^3$/min is taken, in the form of an air flow A, from the outer atmosphere into the air cleaning device through the narrowest air discharging portion 48 having an area of 0.25 m$^2$. Together with the air around the first blower unit 42 taken in the carrier stage 9 through the slit 44, the air delivered in the form of an air flow A in the carrier stage 9 through the first slit 36 is discharged as an air flow B at an amount of 18 m$^2$/min from the carrier stage 9 through the filter 38.

The air discharged in the form of an air flow B is taken in the second blower unit 52 by the operation of the air fan in the second blower unit 52, and the air of 4.5 m$^3$/min is sent out in the form of an air flow C through the filter 50 provided on the air discharging portion 48. The area of the air discharging portion of the first blower unit 42 is larger than the area of the air discharging portion of the second blower unit 52. Thus, part of the air discharged from the first blower unit 42 does not enter the second blower unit 52 but reenters the first blower unit 42 through the slit 44.

The air delivered from the second blower unit 52 in the form of an air flow C passes through the region on the carrier I/O port 7 and is taken in the bottom duct 46 through an opening 46a thereof. The air taken in the bottom duct 46 is conducted to the third blower unit 54 and blown out as an air flow D of 36 m³/min from the filter 14 of the third blower unit 54.

The air flow D passes through the loading space 25 to form a clean air flow and is delivered into the side duct 56 such that the air is returned to the third blower unit 54 through the bottom duct 46 to be sent out from the third blower unit 54 again. In this connection, the bottom duct 46, the third blower unit 54, the loading space 25, the slit 60 and the side duct 56 form an air circulating path.

Part of the air sent out from the third blower unit 54 is discharged, from the rear wall of the casing 1a, as an air flow E at the same flow amount (4.5 m³, for example) as that of the taken-in clean air.

In this embodiment of the air cleaning apparatus, a small amount of air is taken in and a great amount of clean air is circulated in the apparatus. As a result, this apparatus has the advantages that the temperature of clean air is not raised, the contamination of the filters is suppressed and much amount of clean air is supplied by using a small driving power.

Wafers 20 are transferred from the wafer cassettes 6 to the wafer boat 3 by means of the wafer transfer 11 in the loading space 25 in which such a clean air flow is formed. Thereafter, the wafer boat 3 supporting the wafers 20 are put in the heat treating furnace 2 to be heat-treated in the required manner. After the heat treatment, the wafer boat 3 is taken out of the heat treating apparatus 2 and then the wafers 20 are moved from the wafer boat 3 to the wafer cassettes 6 in the loading space in which the clean air is formed, thereby completing the heat treatment.

The control device of the wafer transfer and the like arranged in the bottom duct 46 can readily be maintained after removing the bottom plate 66 of the bottom duct 46. When it is necessary to remove the third blower unit 54 to perform the maintenance, the positioning can easily be done by means of the connection member 64, and further the third blower unit 54 ca be detached without damaging the packing 62. In addition, when a plurality of the vertical heat treating apparatuses are arranged side by side to form a multiple heat-treating system, the system can very easily be maintained.

The inventor of this invention and his helpers made experiments to confirm that a good degree of cleanliness of each portion in the vertical heat treating apparatus can be maintained when air supply to the carrier stage 9 by means of the first blower unit 42 is 8.6 m³/min or more (at an air flow speed of 0.27 m/sec or more), air supply to the carrier I/0 port 7 by means of the second blower unit 52 is 9.5 m³/min or more (at an air flow speed of 0.7 m/sec or more), air supply by means of the third blower unit 54 at its front side at which the air is sent to the transfer stage 10 is 26.2 m³/min or more (at an air flow speed of 0.4 m/sec or more), air supply to the carrier I/O port 7 by means of 54 at its rear side at which the air is sent to the wafer boat 3 is 18.8 m³/min or more (at an air flow speed of 0.28 m/sec or more).

The third blower unit will now be described in more detail.

Figure 7:
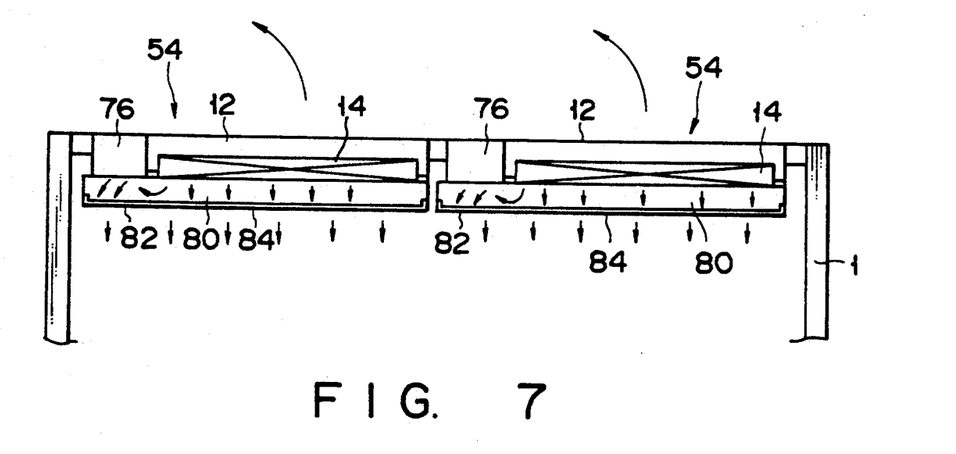
FIG. 7 is a horizontal cross-sectional view of a door of the vertical heat treating apparatus.

As shown in FIGS. 3 and 7, the third blower unit 54 comprises the two doors 12 connected to the casing 1a by means of hinges 76. Each door 12 is provided with the air filter 14 such as a ULPA filter. In front of each filter 14 is disposed a uniform pressure plate 84 having an area by 20% larger than the area of the filter 14 with a gap 80 formed therebetween. The uniform pressure plate 84 is made from an iron plate having a thickness of 1.0 mm and formed with a great number of holes having a diameter of 5 mm at intervals of 8 mm. The plate 84 acts to make uniform the pressure of air conducted through the corresponding filter 14 to the plate 84 and allow clean air to flow out of the front face of the plate 84 itself. The plate 84 has an extension portion 82 covering the front face of the hinges 76.

Figure 8:
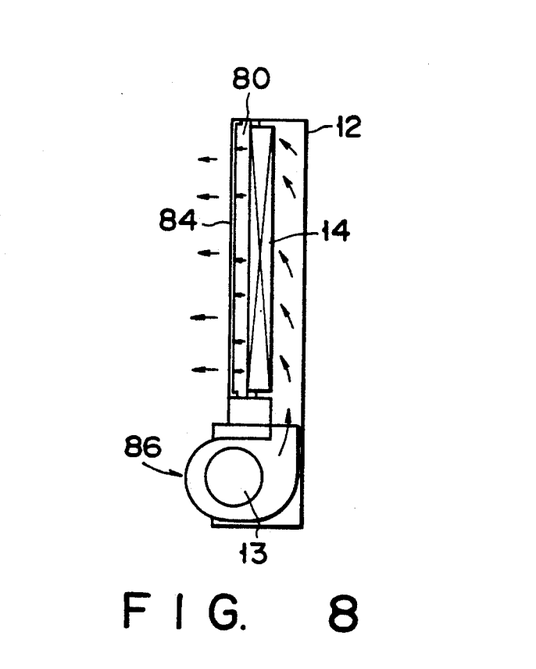
FIG. 8 is a vertical cross-sectional view of the door of FIG. 7.

As shown in FIG. 8, each filter 14 is connected to a blower unit 86 via a duct constituting the door 12. The blower unit 86 is provided with an air fan 13 from which an air flow is conducted to the corresponding door 12.

During the operation of the third blower unit 54, wafer cassettes 6 are loaded on the carrier I/O port 7. The air fans 13 are driven before the carrier transfer 8 is started.

When the air pressure is raised to 13 mm $H_2O$ or more, for example, clean air flows through the filters 14. The air pressure in the space 80 defined between the filter 14 and the uniform pressure plate 84 is made uniform by means of the uniform pressure plate 84 disposed in front of the filter 14, and clean air flows through the holes of the uniform pressure plate 84 to the loading space 25. At the portion of the door 12 where the filter 14 is not present, the air flow is rendered uniform by means of the uniform pressure plate 84 such that the overall loading space 25 is filled with clean air whereby no hindrance of air flow occurs. Consequently, wafers 20 are transferred to the wafer boat 3 without being contaminated due to the hindrance of air flow.

After the transfer of the wafers 20, the wafer boat 3 is lifted by means of the boat elevator 4 and put in the heat treating furnace 2 to be heat-treated. Thereafter, the wafers 20 are transferred from the wafer boat 3 to the wafer cassettes 6 also in the clean air flow in the reverse steps.

The maintenance of the wafer transfer 11 is readily and effectively performed by opening the doors 12.

Figure 9:
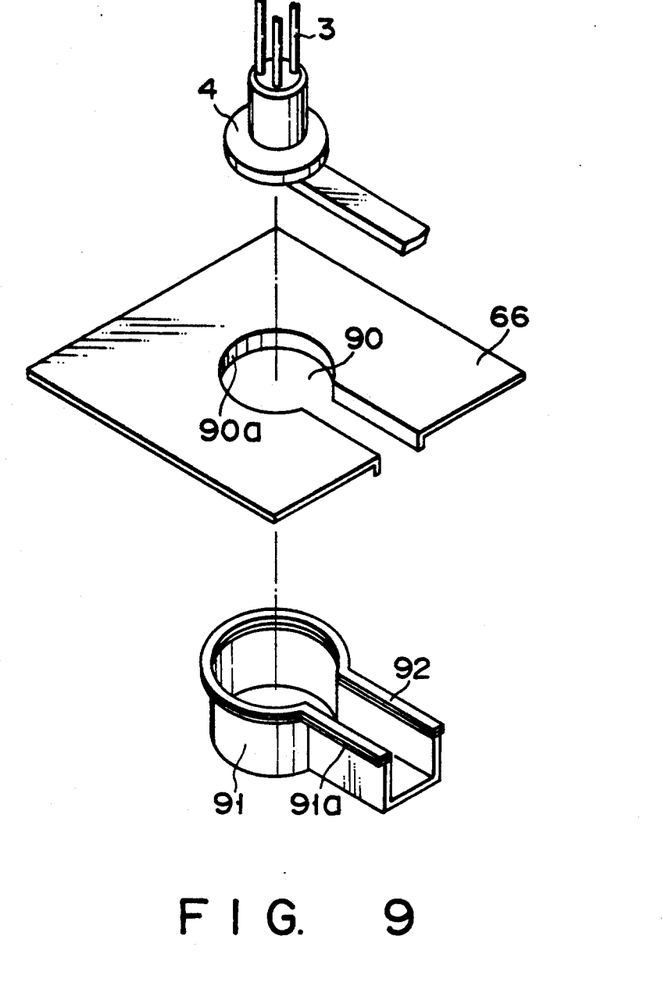
FIG. 9 is an exploded perspective view of a bottom plate forming the bottom duct.
Figure 10:
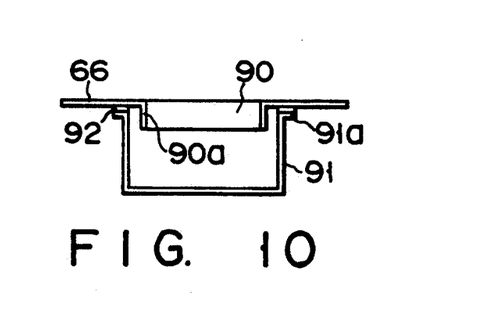
FIG. 10 is a cross-sectional view of the bottom plate.

In FIGS. 9 and 10 is shown a modification of the bottom plate 66 depicted in FIG. 6. A key-hole shaped notch 90 is formed in the modified bottom plate 66 made of stainless steel. A flange shaped peripheral wall 90a is formed on the undersurface of the bottom plate 66 whose inner wall is flush with the inner wall of the notch 90. The notch 90 is blocked at its lower edge by a blocking member 91. On the upper surface of the blocking member 91 is formed a collar 91a on which a packing 92 made of rubber is mounted. The blocking member 91 is connected to the bottom plate 66 by fitting the collar 91a to the undersurface of the bottom plate 66 with the packing 92 interposed therebetween.

The boat elevator 4 is lowered from the heat treating furnace 2 and enters the blocking member 91. Since the lowered boat elevator 4 is at a high temperature, the packing 92 would be likely to be deteriorated by heat radiated from the boat elevator 4 if the packing 92 were not protected. Since, however, the packing 92 is protected by the peripheral wall 90a of the bottom plate 66, radiated heat does not affect the packing 92.

Because the bottom duct is formed by the bottom plate, the loading space in the casing of the vertical treating apparatus can effectively be used, rendering the apparatus small.

This invention is not limited to the above-mentioned embodiment and the modification but is applicable to various modifications within the scope of this invention.

What is claimed is:

1. A vertical heat treating apparatus comprising:
   a casing having one side, a second side opposed thereto and an opening through which articles to be processed are loaded and unloaded, said casing having a space formed therein;
   a heat treating furnace provided in said casing;
   loading and unloading means provided under said heat treating furnace in said space of said casing, for loading said articles to be processed in and unloading the same from said heat treating furnace; and
   clean air flow forming means provided in said space in said casing for forming a clean air flow conducted from said one side of said casing to the second side thereof.

2. The apparatus according to claim 1, wherein said casing has a lateral side, and said clean air forming means has doors provided on the lateral side of said casing, and air fans and air filters housed in the doors.

3. The apparatus according to claim 2, wherein each of said filters has an air discharging side, and said clean air flow forming means includes a uniform pressure plate having an area larger than areas of said air filters and provided at said discharging side of each of said filters, for delivering air into said space in a substantially uniformly diffused manner.

4. The apparatus according to claim 1, wherein said casing has one lateral side and a second lateral side opposite thereto; and wherein said clean air flow forming means comprises:
   a clean air discharging portion provided on said one lateral side of said casing and having air taking-inn means;
   a side duct provided on said second lateral side of said casing;
   a bottom duct for connecting said clean air discharging portion with said side duct; and
   air circulating means comprising said clean air discharging means, said side duct and said bottom duct, for circulating air from said clean air discharging means to said clean air discharging means itself through said side duct and said bottom duct.

5. The apparatus according to claim 4, wherein said side duct has discharge means for discharging, externally of said casing, the same amount of air as is taken in said side duct.

6. The apparatus according to claim 4, wherein said casing has a bottom face, and said bottom duct comprises said bottom face of said casing and a bottom plate disposed separated from said bottom face.

7. The apparatus according to claim 6, wherein said bottom plate has a depressed portion for receiving therein said loading and unloading means when said loading and unloading means is in an unloading state.

* * * * *